United States Patent
Yamasaki et al.

(10) Patent No.: US 9,397,473 B2
(45) Date of Patent: Jul. 19, 2016

(54) LASER DIODE AND TRANSMITTER MODULE

(71) Applicant: Sumitomo Electric Device Innovations, Inc., Yokohama-shi (JP)

(72) Inventors: Yasuo Yamasaki, Yokohama (JP); Nobumasa Okada, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/500,093

(22) Filed: Sep. 29, 2014

(65) Prior Publication Data

US 2015/0092803 A1  Apr. 2, 2015

(30) Foreign Application Priority Data

Sep. 30, 2013  (JP) .................................. 2013-205137

(51) Int. Cl.
*H01S 5/042* (2006.01)
*H01S 5/022* (2006.01)
*H01S 5/223* (2006.01)

(52) U.S. Cl.
CPC ........... *H01S 5/0425* (2013.01); *H01S 5/02248* (2013.01); *H01S 5/02276* (2013.01); *H01S 5/2231* (2013.01); *H01S 5/02284* (2013.01); *H01S 5/0427* (2013.01)

(58) Field of Classification Search
CPC .... H01S 5/0422; H01S 5/0425; H01S 5/0427
See application file for complete search history.

(56) References Cited

U.S. PATENT DOCUMENTS

| | | | |
|---|---|---|---|
| 6,553,044 B1 * | 4/2003 | Eden | 372/38.02 |
| 7,656,914 B1 * | 2/2010 | Reid et al. | 372/26 |
| 2002/0050596 A1 * | 5/2002 | Otsuka et al. | 257/81 |
| 2003/0058898 A1 * | 3/2003 | Beier | 372/3 |
| 2003/0169796 A1 * | 9/2003 | Nakamura et al. | 372/46 |
| 2004/0233946 A1 * | 11/2004 | Moto | 372/36 |
| 2006/0018358 A1 * | 1/2006 | Kadowaki et al. | 372/87 |
| 2006/0176918 A1 * | 8/2006 | Aruga | 372/38.1 |
| 2007/0071050 A1 * | 3/2007 | Kuramoto | 372/43.01 |
| 2010/0296541 A1 * | 11/2010 | Nakatani | 372/46.01 |
| 2010/0296542 A1 * | 11/2010 | Murasawa et al. | 372/46.011 |

FOREIGN PATENT DOCUMENTS

JP  05082907 A  *  4/1993  ............... H01S 3/18
JP  2013-080900     5/2013

* cited by examiner

*Primary Examiner* — Joshua King
(74) *Attorney, Agent, or Firm* — Venable LLP; Michael A. Sartori; F. Bock Riggs

(57) ABSTRACT

A transmitter module that includes a laser diode (LD) and a driver, each mounted on a sub-mount, is disclosed. The driver directly drives the LD by supplying a modulation signal, a bias signal, and a reference. Two signals are provided to a first pad of the LD, while, the reference is provided to the second pad of the LD. The second pad in the center thereof is formed relatively closer to the second facet of the LD opposite to the first facet through which the laser light is emitted.

10 Claims, 6 Drawing Sheets

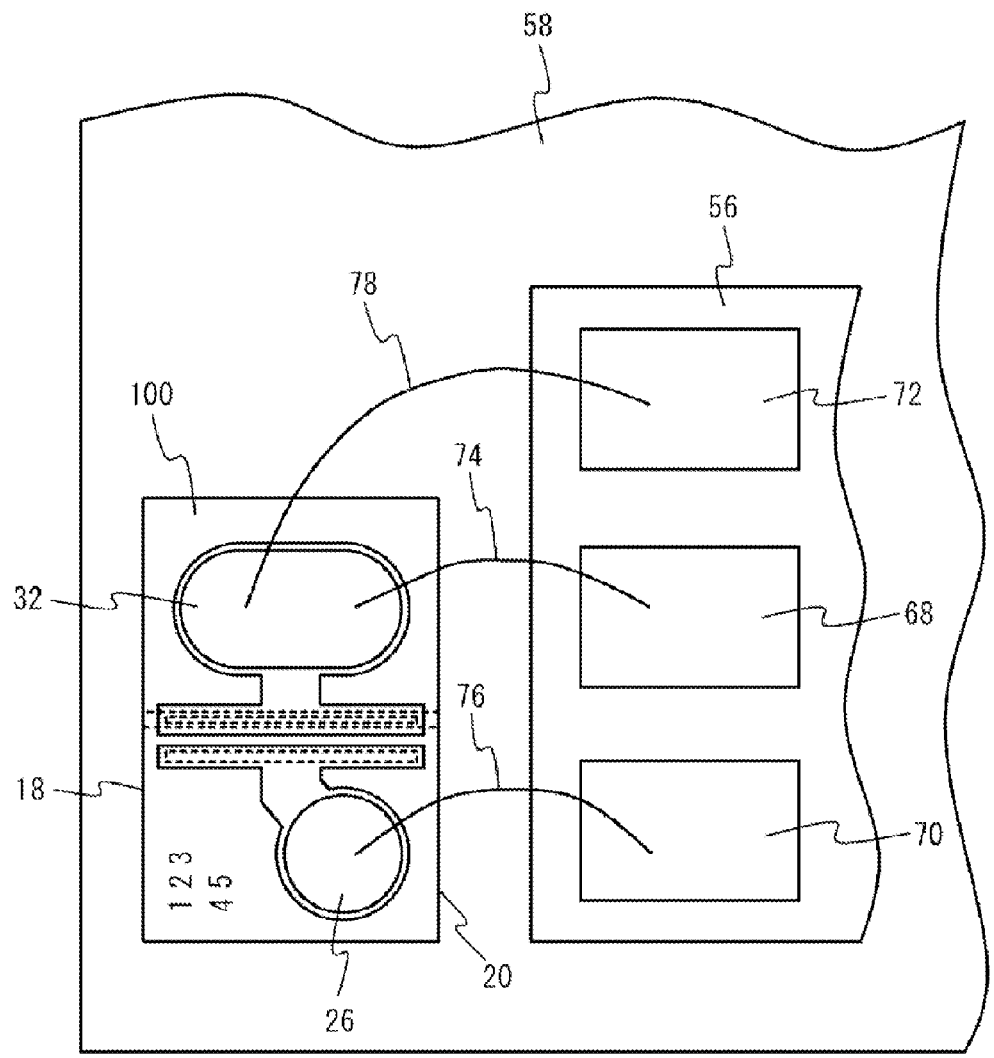

LASER DIODE AND TRANSMITTER MODULE

BACKGROUND OF THE INVENTION

1. Field of the Invention

The present invention relates to a laser diode (LD) and a transmitter module installing the LD.

2. Related Background Art

Japanese Patent Application Publication No. 2013-80900 discloses a transmitter module equipped with an LD as a signal light source in optical communications. The LD has a structure in which an active layer is sandwiched between an n-type semiconductor layer and a p-type semiconductor layer.

SUMMARY OF THE INVENTION

One aspect of the present application relates to a transmitter module that includes, a laser diode (LD), a driver, and first to third bonding wires. The LD has a first facet that emit laser light and a second facet opposite to the first facet. The LD further includes a first pad and a second pad. The driver, which is positioned so as to face the second facet of the LD, directly drives the LD by supplying a bias signal and a modulation signal both to the first pad of the LD. The first bonding wire connects the first pad to the driver to supply the modulation signal. The second bonding wire connects the second pad of the LD to the driver. The third bonding wire connects the first pad of the LD to the driver to supply the bias signal. A feature of the transmitter module is that the second pad of the LD is formed closer to the second facet; thereby the second bonding wire in a length thereof may be comparable to a length of the first bonding wire.

BRIEF DESCRIPTION OF THE DRAWINGS

The above-described objects and other objects, features, and advantageous effects of the present invention can be better understood with reference to the following detailed description of the preferred embodiments of the present invention, made with reference to the attached drawings.

FIG. 4 is an enraged plan view showing a region mounting an LD and a driver.

DESCRIPTION OF THE PREFERRED EMBODIMENTS

Figure 1A:
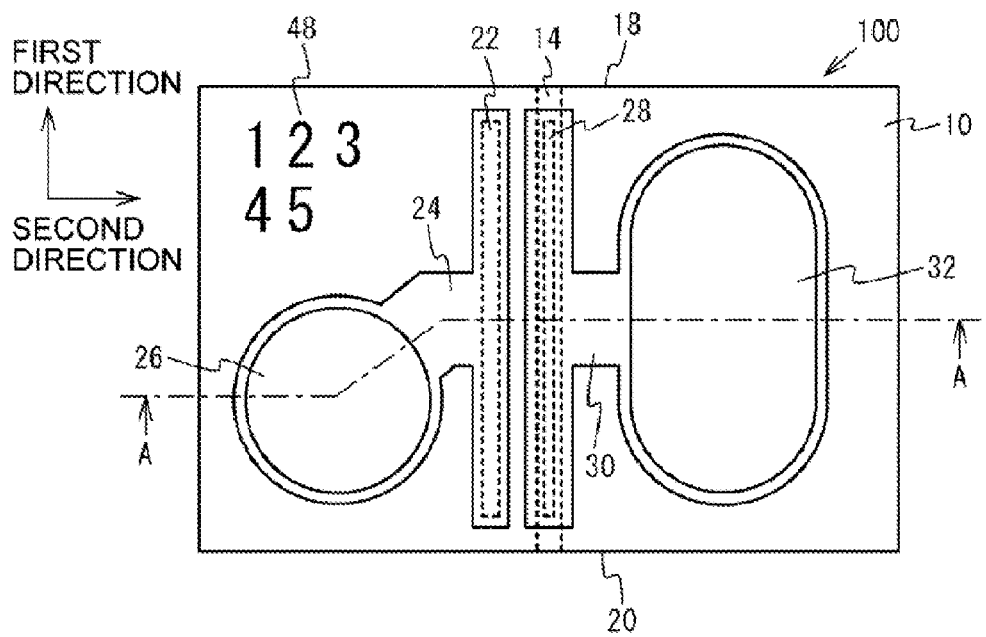
FIG. 1A is a plan view showing an LD according to Example 1.

The findings of the present invention may be better understood with consideration given to the following detailed description made with reference to the attached drawings shown as examples. Embodiments of the LD and the transmitter module according to the present invention are described below with reference to the attached drawings. The identical parts are denoted by the identical reference numerals if possible. The examples of the present invention are described below with reference to the drawings.

First Embodiment

Figure 1B:
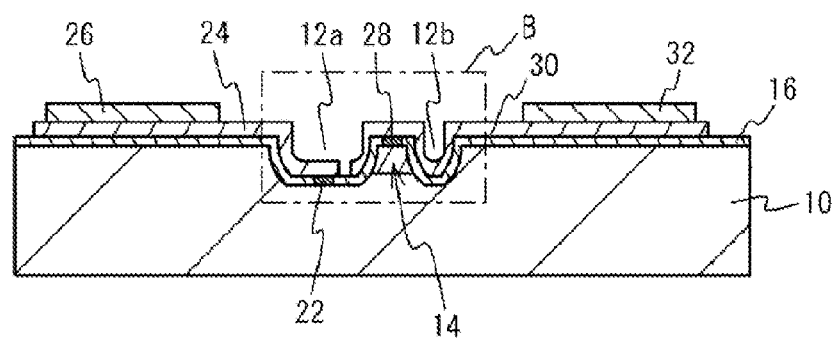
FIG. 1B is a view showing a cross section taken along the line A-A of FIG. 1A.
Figure 1C:
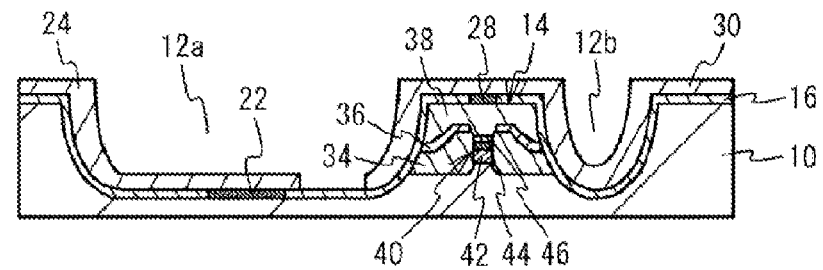
FIG. 1C is an enlarged view showing a region B of FIG. 1B.

FIG. 1A is a plan view showing an LD according to the first embodiment. FIG. 1B shows a cross section taken along the line A-A of FIG. 1A. FIG. 1C magnifies a region B in FIG. 1A. As shown in FIGS. 1A to 1C, an LD 100 includes a semiconductor stack and a substrate 10, the semiconductor stack on the substrate 10 is provided with grooves 12a and 12b, putting a primary portion 14 therebetween.

The primary portion 14 includes a mesa 40, a first burying layer 34 provided on the side of the mesa 40, a second burying layer 36 provided on the first burying layer 34, and a third burying layer 38 provided on the mesa 40 and the second burying layer 36, where the layers, 34 to 38, are provided on the substrate 10. The mesa 40 includes a lower cladding layer 42 (a first conductivity-type semiconductor layer), an active layer 44, and an upper cladding layer 46 (a second conductivity-type semiconductor layer) stacked on the substrate 10 in this order. The first burying layer 34 and the second burying layer 36 form a burying region provided on the side of the mesa 40. An insulating film 16 is provided to cover the grooves 12a and 12b, the primary portion 14, and the substrate 10.

The substrate 10 is, for example, an n-type InP substrate. The lower cladding layer 42 has the same conductivity type as the substrate 10, and may be made of, for example, n-type InP with a thickness of 0.5 μm. The active layer 44 is a type of, for example, a multiple quantum well structure including an InGaAsP. The upper cladding layer 46 has a conductivity type opposite to that of the lower cladding layer 42 and may be made of, for example, p-type InP with a thickness of 0.2 μm. The first burying layer 34 is made of, for example, p-type semiconductor material, for example, p-type InP with a thickness of 1.3 μm. The second burying layer 36 is made of, for example, n-type semiconductor material, for example, n-type InP with a thickness of 0.2 μm. The third burying layer 38 may be made of material and the conductivity type same as those of the upper cladding layer 46, and functions same as those of the first and second cladding layers. The third burying layer 38 may be made of, for example, p-type InP with a thickness of 2.0 μm. The insulating film 16 may be, for example, a silicon nitride film.

The LD 100 has a rectangle plane shape, with a first facet 18 and a second facet 20. The first facet 18 emits an optical beam from the active layer 44. The second facet 20 locates on the side opposite to the first facet 18. The primary portion 14 extends from the first facet 18 to the second facet 20 (in other words, extends along the cavity). That is, the mesa 40 extends from the first facet 18 to the second facet 20. As shown in FIGS. 1A to 1C, a direction in which the primary portion 14 extends (i.e., the direction that extends from one of the first facet 18 and the second facet 20 toward the other) is referred to as the first direction, and the direction intersecting the first direction is referred to as the second direction.

The insulating film 16 is partially removed within the groove 12a in one side of the primary portion 14 to expose the substrate 10. An n-terminal 22 covers the exposed substrate 10, and the n-terminal 22 is an ohmic electrode made of, for example, a metal stack including an alloy of gold and germanium (AuGe), nickel (Ni), and Au. The n-terminal 22 extends in the first direction. One end of an n-interconnection 24 is connected to the n-terminal 22, and the other end of the n-interconnection 24 is connected to the n-pad 26. The n-interconnection 24 extends from the central part of the n-terminal 22 to the n-pad 26. Specifically, the n-interconnection 24 has a bent portion and includes a first part extending from the n-terminal 22 to the bent portion along the second direction and a second part extending obliquely from the first part diagonally to the n-pad 26. The n-interconnection 24 is made of, for example, gold (Au) with a thickness of 3 µm. The n-pad 26 is made of, for example, plated gold with a thickness of 6 µm. The n-pad 26 is electrically connected to the lower cladding layer 42 through the n-interconnection 24, the n-terminal 22 and the substrate 10.

The n-pad 26 locates closer to the second facet 26, that is, a distance from the n-pad 26 to the second facet 20 is shorter than a distance from the n-pad 26 to the first facet 18. As described above, the n-pad 26 (the first pad), which is provided in one of the two regions partitioned by the mesa 40, is electrically connected to the lower cladding layer 42 through the n-terminal 22, and locates closer to the second facet 20. Specifically, the center of the n-pad 26 locates closer to the second facet 20 by a distance less than a half distance between two facets, 18 and 20, along the first direction. As shown in FIG. 1A, the n-pad 26 has, for example, a circular shape, but unlimited thereto. The n-pad 26 may be a rectangular shape and so on.

The insulating film 16 provides an opening in the primary portion. This opening has, for example, a stripe shape. The third burying layer 38 is exposed in the opening. A p-terminal 28 covers the exposed part of the third burying layer 38, and has a function of an ohmic electrode. The p-terminal 28 is composed of a stack including, for example, titanium (Ti), platinum (Pt), and gold (Au). The p-terminal 28 extends in the first direction on the primary portion 14. One end of the p-interconnection 30 is connected to the p-terminal 28, and the other end of the p-interconnection 30 is connected to the p-pad 32. The p-interconnection 30 extends from the center of the p-terminal 28 to the p-pad 32. Specifically, the p-interconnection 30 extends straightly from the p-terminal 28 along the second direction and is connected to the p-pad 32 without any bent. The p-interconnection 30 is made of, for example, gold (Au) with a thickness of 3 µm. The p-pad 32 is made of, for example, plated gold with a thickness of 6 µm. The p-pad 32 is formed in the other of the two regions partitioned by the mesa 40, in other words, on the region opposite to the region where the n-pad 26 is formed. The p-pad 32 is electrically connected to the upper cladding layer 46 via the p-interconnection 30, the p-terminal 28, and the third burying layer 38.

The p-pad 32 in the central part thereof locates between the first facet 18 and the second facet 20 and has a size longer than the n-pad 26 along the first direction. A distance from the p-pad 32 to the first facet 18 is substantially the same as a distance from the p-pad 32 to the second facet 20. When the length of the p-pad 32 and the length of the n-pad 26 are assumed to respective maximum lengths along the first direction, the length of the p-pad 32 is longer than that of the n-pad 26. Although the p-pad 32 has an extended circular shape as shown in FIG. 1A but unlimited thereto. The p-pad 32 may have, for example, a rectangular shape and so on. In an example, the LD 100 has the distance from the edge of the n-pad 26 to the first facet 18 longer than the distance from the edge of the p-pad 32 to the first facet 18. The distance from the edge of the n-pad 26 to the first facet 18 is longer than the distance from the edge of the p-pad 32 to the second facet 20.

The LD 100 of the first embodiment is, what is called, the direct modulation type, and a modulation current with high frequency components is directly injected to the LD 100. Thus, an electrical signal containing a direct-current (DC) signal, namely a bias signal, and alternating-current (AC) signal, namely a modulation signal containing high frequency components, is applied to the p-pad 32. Specifically, the p-pad 32 receives a bias signal and a modulation signal. The n-pad 26 is connected to a reference potential (e.g., a ground potential). An LD of the direct modulation type generally provides one pad on a top surface thereof for applying the bias signal and the modulation signal, and another pad connected to a reference potential on the back substrate. In the LD 100 of the first embodiment, both pads are provided on the top surface thereof from viewpoints of the parasitic capacitance and the impedance matching.

As described above, the plural bonding wires for applying both of the bias signal and the modulation signal are connected to the p-pad 32. In order to secure an area for binding the plural wires in the p-pad 32, the p-pad 32 has a shape in which the size along the first direction is greater than that along the second direction. On the other hand, one bonding wire is to be connected to the n-pad 26 to supply a reference potential thereto, and a condition for bonding a single wire to the n-pad 26 allows the area of the n-pad 26 to be smaller than that of the p-pad 32.

Figure 2:
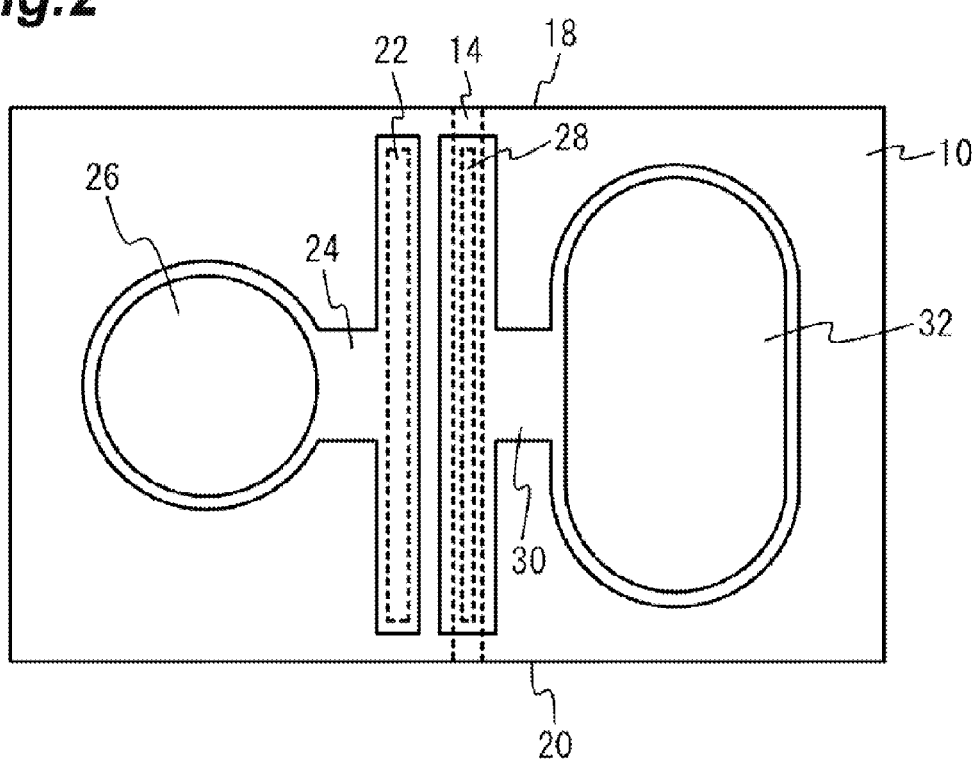
FIG. 2 is a plan view showing an LD according to Comparative Example 1.

In order to explain an advantage of the LD of the first embodiment, an LD comparable to the first embodiment is described. FIG. 2 is a plan view showing an LD according to comparable example. As in FIG. 2, a p-pad 32 and an n-pad 26 both are provided in the central part between a first facet 18 and a second facet 20. Specifically, a distance from the n-pad 26 to the first facet 18 is almost equal to a distance from the n-pad 26 to the second facet 20. Thus, both of the n-pad 26 and the p-pad 32 are provided in the central part between the first facet 18 and the second facet 20 based on consideration that currents should be applied uniformly across the active layer 44 along the first direction.

Light generated in the active layer 44 is emitted from the first facet 18; accordingly, a driver, which is in an integrated circuit (IC), is necessary to be placed behind the second facet 20. Terminals in the driver are connected to the n-pad 26 and the p-pad 32 via bonding wires, respectively. The n-pad 26 is smaller than the p-pad 32, so that the bonding wire connecting one terminal on the driver to the n-pad 26 becomes longer compared to that for the p-pad 32, because of a pad arrangement where the n-pad 26 and the p-pad 32 are formed in the central part between the first facet 18 and the second facet 20. This pad arrangement degrades high-frequency performance of an LD.

In contrast, as shown in FIG. 1A, the first embodiment sets the center of the n-pad 26 in a position closer to the second facet 20 by a distance shorter than a half of the full distance from the first facet 18 to the second facet 20. This arrangement may shorten the bonding wire connecting the terminal on the driver to the n-pad 26. The deterioration of the high-frequency performance may be suppressed.

Since the center of the n-pad 26 along the first direction is positioned closer to the second facet 20, the region provided between the n-pad 26 and the first facet 18 becomes wider compared to a region between the n-pad 26 and the second facet 20. Therefore, as shown in FIG. 1A, an identification mark 48 may be provided between the n-pad 26 and the first facet 18. The identification mark 48 includes one or more patterns or characters for identifying the LD 100, for example, a sequential characters or numerals as shown in FIG. 1A may be applicable for the identification mark 48. Moreover, the identification mark 48 may be formed concurrently with the formation of the n-pad 26 and the p-pad 32, and made of, for example, by plated gold.

In order to inject current into the active layer 44 uniformly along the first direction, the n-interconnection 24 is preferably brought out from the central part of the n-terminal 22, and the p-interconnection 30 is also preferably brought out from the central part of the p-terminal 28. Moreover, in order to set the bonding wire connected to the n-pad 26 and that connected to the p-pad 32 to have a same length, the distance from the n-pad 26 to the second facet 20 preferably becomes almost equal to the distance from the p-pad 32 to the second facet 20.

The first embodiment has an exemplary structure in which the center of the n-pad 26 is positioned closer to the second facet 20, and the p-pad 32 is expanded along the first direction, but the present embodiment is not limited thereto. For example, the p-pad 32 may be positioned closer to the second facet 20, and the n-pad 26 may be expanded along the first direction. Generalizing the arrangement of the present embodiment, the first pad connected to one of the lower cladding layer 42 having the first conduction-type and the upper cladding layer 46 having the second conduction type each contained in the mesa 40 is set such that the center thereof along the first direction is closer to the second facet 20, and the second pad connected to the other of the lower cladding layer 42 and the upper cladding layer 46 is elongated along the first direction compared to the first pad.

The first embodiment has an exemplary structure in which the first conduction type is the n-type and the second conduction type is the p-type; but the present embodiment is not limited to those arrangement. The first conductivity type may be the p-type, while, the second conductivity type may be the n-type. Moreover, the LD of the present embodiment has a buried hetero-structure and includes a mesa 40 formed by etching from the third burying layer 38 to a portion of the lower cladding layer 42, and this mesa 40 is buried by the burying layers. However, the present embodiment is not limited thereto. The LD may have a ridge waveguide structure with a mesa formed by etching the upper cladding layer.

Second Embodiment

Figure 3A:
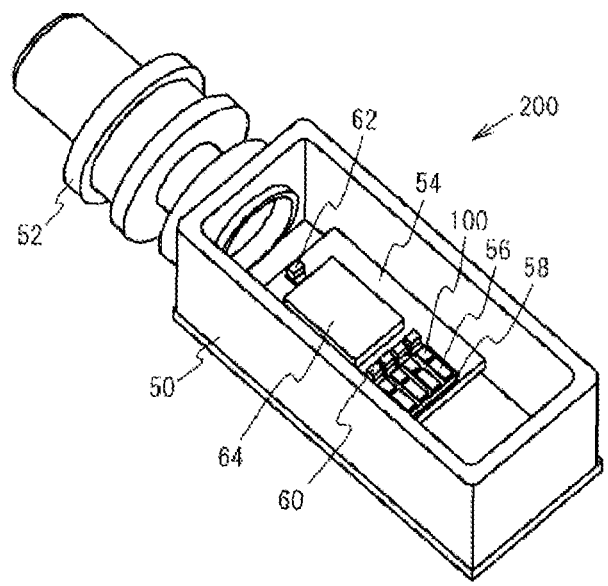
FIG. 3A is a perspective view showing a transmitter module according to Example 2.
Figure 3B:
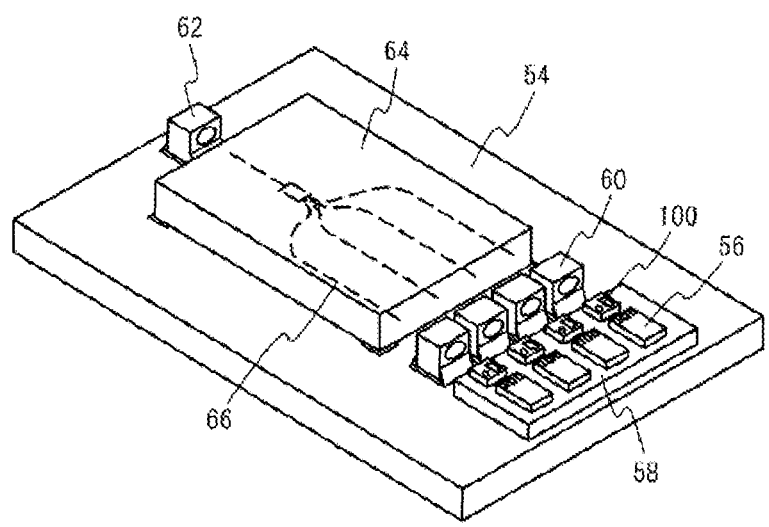
FIG. 3B is an enlarged perspective view showing a carrier in FIG. 3A.

FIG. 3A is a perspective view showing a transmitter module according to the second embodiment of the invention. FIG. 3B magnifies a portion of a chip carrier contained in the transmitter module shown in FIG. 3A. Referring to FIGS. 3A and 3B, the transmitter module 200 provides, for example, a sleeve 52 connected to a package 50 of a rectangle shape, and a carrier 54 stored in the package 50. The sleeve 52 secures an optical fiber optically coupled with the LD. In FIG. 3A, the upper part, e.g., a lid of the package 50 is omitted in order to show the inside of the package 50. However, the transmitter module 200 actually provides a lid on side walls of the package 50 to seal the package 50.

The carrier 54 mounts a sub-mount 58, which places plural LDs 100 thereon of the first embodiment and plural drivers 56, plural first lenses 60, a second lens 62, and an optical multiplexer 64. The LDs 100 and the drivers 56 are mounted on sub-mount 58, while, the first lenses 60 each corresponding to respective LDs 100 are mounted on the sub-mount 58. The LDs 100 emit laser beams each having a specific wavelength different from the others. The LDs 100 are electrically connected to respective drivers 56 via bonding wires. These bonding wires are shown in FIG. 4 and are omitted in FIGS. 3A and 3B in order to clarify the drawings.

The optical signals output from respective LDs 100, which are controlled by the drivers 56, are focused by the first lenses 60, and the laser beams thus concentrated enter the optical multiplexer 64. The optical multiplexer 64 includes optical waveguides 66. The optical multiplexer 64 receives the concentrated laser beams, which propagate in the respective optical waveguides 66, to form a multiplexed optical signal. The multiplexed optical signal emitted from the optical multiplexer 64 is focused by the second lens 62 on the optical fiber held in the sleeve 52.

As described above, the transmitter module 200 of the second embodiment includes plural LDs 100 that generate respective laser beams each having a specific wavelength different from others. The laser beams from the LDs 100 are multiplexed by the optical multiplexer 64 to be coupled with the single optical fiber secured in the sleeve 52. The optical fiber propagates the optical signal containing plural wavelengths different from others, thereby increasing the transmission capacity.

FIG. 4 is an enlarged plan view showing a portion of the carrier 54, which includes a single LD, a single driver, and the first to third bonding wires, 74, 87, and 76, respectively. As shown in FIG. 4, the driver 56 positions behind the second facet 20 of the LD 100. The p-pad 32 is formed in both of a first region near the second facet 20 and a second region located near the first facet 18. One end of the first bonding wire 74 is connected to the first region of the p-pad 32. The other end of the first bonding wire 74 is connected to the signal terminal 68 of the driver 56. One end of a third bonding wire 78 is connected to the second region of the p-pad 32, and the other end of the third bonding wire 78 is connected to a power supply terminal 72 of the driver 56. The first region of the p-pad 32 is between the second facet 20 and the center of the p-pad 32 along the first direction (see FIG. 1A). The second region of the p-pad 32 is between the first facet 18 and the center of the p-pad 32 along the first direction.

One end of the second bonding wire 76 is connected to the n-pad 26, while, the other end thereof is connected to a ground terminal 70 of the driver 56. The first to third bonding wires, 74 to 78, are made of metal such as aluminum. The reason why the p-pad 32 is connected to the signal terminal 68 through the first bonding wire 74 and connected to the power supply terminal 72 through the third bonding wire 78 is that the LD 100 as described in the first embodiment is the type of the direct modulation. In a modification, the n-pad 26 may receive another modulation signal from the ground terminal instead of being connected to the ground, where another modulation signal has a phase opposite to the phase of the modulation signal applied to the p-pad 32. This arrangement may drive the LD 100 in the differential mode by the positive phase signal to the p-pad 32 and the negating phase signal to the n-pad 26.

The transmitter module according to the second embodiment includes the LDs 100 of the first embodiment and drivers 56 disposed behind the second facets 20 of respective LDs 100. In each of the LDs 100, as described in the first embodiment, the center of the n-pad 26, where the n-pad has a length along the first direction smaller than that of the p-pad 32, positions closer to the second facet 20. The pad arrangement of the embodiment may set the second bonding wire 76 connecting the n-pad 26 to the ground terminal 70 of the driver 56 to be relatively shorter length, thereby suppressing the deterioration of the high-frequency performances.

Figure 5A:
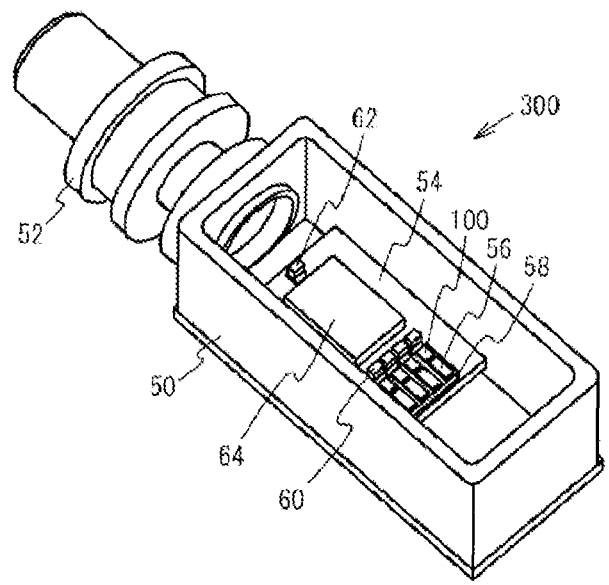
FIG. 5A is a perspective view showing a transmitter module according to a modification 1 of Example 2.
Figure 5B:
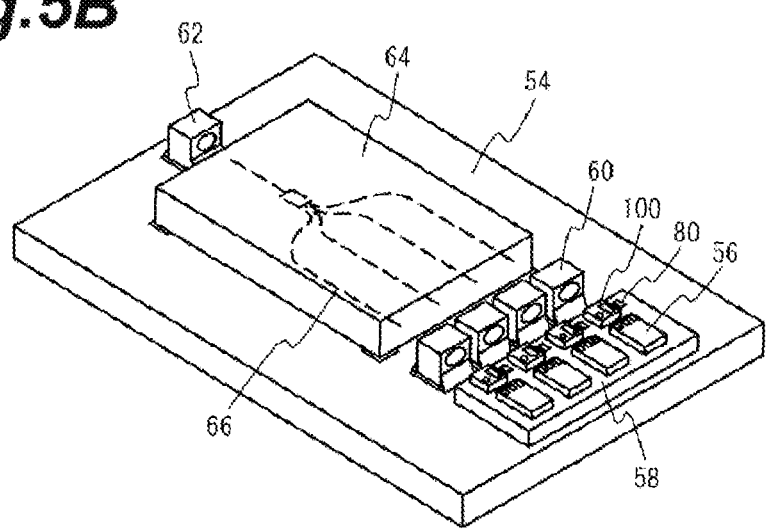
FIG. 5B is an enlarged perspective view showing a carrier in FIG. 5A.
Figure 6:
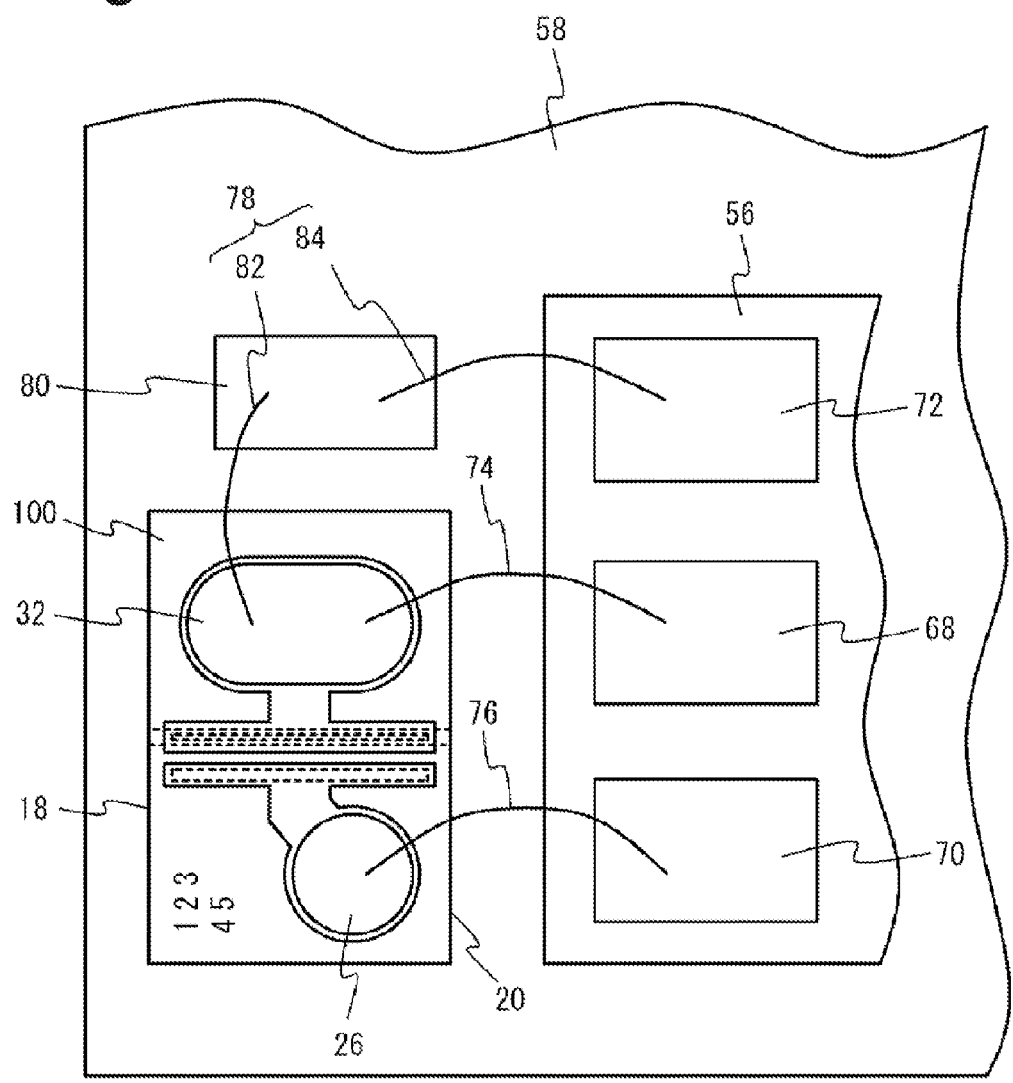
FIG. 6 is an enraged plan view showing a region mounting an LD and a driver.

A transmitter module according to another embodiment modified from the second embodiment will be described below. FIG. 5A is a perspective view showing the transmitter module 300 according to the modified embodiment. FIG. 5B magnifies a portion of a chip carrier of FIG. 5A. In FIGS. 5A and 5B, as in the FIGS. 3A and 3B, bonding wires which electrically connect the LDs 100 and the drivers 56 are omitted in order to clarify the drawings. A transmitter module 300 shown in FIGS. 5A and 5B is substantially the same as that shown in FIGS. 3A and 3B except for the following: Referring to FIGS. 5A and 5B, the transmitter module 300 provides a sub-mount 58 having pads for auxiliary terminals 80. The auxiliary terminals 80 are formed by, for example, plating gold (Au). The p-pads 32 of respective LDs 100 are connected to the power supply terminal 72 of the respective drivers 56 via the corresponding auxiliary terminal 80 by two bonding wires. FIG. 6 illustrates the auxiliary terminal 80 and two bonding wires connected thereto.

FIG. 6 is an enlarged plan view showing an LD 100 and a driver 56 on the sub-mount 58. As shown in FIG. 6A, the third bonding wire 78 is composed of a bonding wire 82 through which the p-pad 32 is connected to the auxiliary terminal 80 and another bonding wire 84 through which the auxiliary terminal 80 is connected to the power supply terminal 72. The first bonding wire 74 and the second bonding wire 76 are already described as referring to FIG. 4.

In the modified example, the pads for the auxiliary terminal 80 are arranged on the sub-mount 58 that mounts the LDs 100. In order to connect the p-pad 32 with the power supply terminal 72, the bonding wire 82 connects the p-pad 32 with the auxiliary terminal 80, and the bonding wire 84 connects the auxiliary terminal 80 to the power supply terminal 72. Such an arrangement implementing two bonding wires may avoid the first bonding wire 74 physically in contact with the third bonding wire 78.

In order to prevent the first bonding wire 74 from being in contact with the third bonding wire 78, the auxiliary terminal 80 preferably positions such that the first bonding wire 74 does not pass over the auxiliary terminal 80. It is preferred that the auxiliary terminal 80 be provided in a position in which the first bonding wire 74 does not step over the auxiliary terminal 80. For example, as shown in FIG. 6, the auxiliary terminal 80 preferably positions near the side face extending from the first facet 18 to the second facet 20 of the LD 100.

While the second embodiment concentrates on a transmitter module having plural LDs 100, the embodiment is not limited thereto. The invention is applicable to a transmitter module including a single LD 100.

While the principle of the present invention is illustrated and described above using the preferred embodiments, it will be understood by a person skilled in the art that various changes in arrangement and details may be made therein without departing from the principle. The present invention is not limited to the specific configurations disclosed in the embodiments. We therefore claim all modifications and variations that fall within the spirit and scope of the following claims.

What is claimed is:

1. A transmitter module comprising:
a laser diode (LD) having a first facet to emit light and a second facet opposite to the first facet, the LD having a first pad and a second pad, and a first conductivity-type semiconductor layer and a second conductivity-type semiconductor layer;
a driver set as facing the second facet of the LD, the driver directly driving the LD by supplying a bias signal and a modulation signal to the first pad of the LD;
a first bonding wire connecting the first pad to the driver to provide the modulation signal; and
a second bonding wire connecting the second pad of the LD to the driver;
wherein the first pad of the LD is connected with the driver to receive the bias signal,
wherein the second pad of the LD is positioned closer to the second facet relative to the first facet,
wherein the first pad is electrically connected to one of the first and second conductivity-type semiconductor layers, and the second pad is electrically connected to the other of the first and second conductivity-type semiconductor layers, and
wherein the first and second pads have first and second lengths, respectively, each of the first and second lengths is defined as a length taken along a first direction from the first facet to the second facet, and the second length is smaller than the first length.

2. The transmitter module according to claim 1, wherein the second bonding wire provides a reference to the LD.

3. The transmitter module according to claim 1, further comprising a third bonding wire connecting the first pad of the LD to the driver to provide the bias signal,
wherein the first pad is expanded along a direction connecting the first facet to the second facet, the first bonding wire being connected to a portion of the first pad relatively closer to the second facet, the third bonding wire being connected to another portion of the first pad relatively apart from the second facet.

4. The transmitter module according to claim 3, further including a sub-mount for mounting the LD and the driver thereon, the sub-mount including an auxiliary terminal thereon,
wherein the third bonding wire includes one wire and another wire, the one wire connecting the first pad to the auxiliary terminal, the another wire connecting the auxiliary terminal to the driver.

5. The transmitter module according to claim 4, wherein the auxiliary terminal is placed as facing one of edges of the LD connecting the first facet to the second facet, one of edges being in a region where the first pad is provided.

6. The transmitter module according to claim 1, wherein the LD has a mesa, an interconnection and a terminal electrode, the mesa includes an active layer, the mesa and the terminal electrode extend in the first direction, the terminal electrode is in contact with the mesa, and the interconnection extends from a center of the terminal electrode to the first pad.

7. The transmitter module according to claim 1, wherein the driver and the LD are arranged in the first direction, and the first bonding wire and the second bonding wire both run in a direction to connect the first pad and the second pad to the driver, respectively,
the transmitter module further comprising a third bonding wire and a fourth bonding wire, the first pad of the LD being connected through the third bonding wire and the fourth bonding wire to the driver, the third bonding wire running in a second direction different from the first direction, and the fourth bonding wire running in the first direction.

8. The transmitter module according to claim 1, wherein the LD has a side different from the first facet and the second facet,
the transmitter module further comprising another LD, the other LD being disposed apart from the LD on the side of the LD.

9. The transmitter module according to claim 1, further comprising a third bonding wire connecting the first pad of the LD to the driver to provide the bias signal.

10. A transmitter module comprising:
first and second laser diodes (LDs) each having a first facet to emit light and a second facet opposite to the first facet, each of the first and second LDs having a first pad, a second pad, a first conductivity-type semiconductor layer and a second conductivity-type semiconductor layer, and the second pad of the first LD being positioned closer to the second facet relative to the first facet of the first LD;

a driver set as facing the second facet of the first LD, the driver directly driving the first LD by supplying a bias signal and a modulation signal to the first pad of the first LD, and the driver and the first LD being arranged in a first direction from the first facet of the first LD to the second facet of the first LD, the first and second LDs being arranged in a second direction, and the second direction being different from the first direction;

a sub-mount having an auxiliary pad, the first and second LDs and the driver being mounted on the sub-mount, the auxiliary pad being disposed between the first and second LDs;

a first bonding wire connecting the first pad of the first LD to the driver to provide the modulation signal;

a second bonding wire connecting to the second pad of the first LD to the driver;

a third bonding wire connecting the first pad of the first LD to the auxiliary pad; and a fourth bonding wire connecting the auxiliary pad to the driver to provide the bias signal, the bias signal being supplied through the third and fourth bonding wires to the first LD.

* * * * *